United States Patent [19]

Keelty

[11] 4,072,905
[45] Feb. 7, 1978

[54] WIDE ACQUISITION RANGE MSK DEMODULATOR INPUT CIRCUIT

[75] Inventor: James Malcolm Keelty, Montreal, Canada

[73] Assignee: RCA Corporation, New York, N.Y.

[21] Appl. No.: 775,861

[22] Filed: Mar. 9, 1977

[51] Int. Cl.² .............................................. H03D 3/00
[52] U.S. Cl. ................................. 329/122; 178/66 R; 325/320; 325/346; 325/419; 331/1 A; 331/2
[58] Field of Search .................. 329/50, 110, 122, 124, 329/125; 178/66 R; 325/320, 346, 349, 419; 331/1 A, 2, 23

[56] References Cited

U.S. PATENT DOCUMENTS 3,993,868 11/1976 Balcewicz ..................... 329/110 X Primary Examiner—Siegfried H. Grimm
Attorney, Agent, or Firm—Edward J. Norton; Roland L. Morneau

[57] ABSTRACT

An input circuit for a wide acquisition range minimum shift keying demodulator includes a pair of phaselocked loops (PLL). Each PLL is designed to receive from a frequency doubler a respective one of two discrete spectral lines in the frequency spectrum separated by a frequency equal to the bit rate. Each PLL operates at one of three frequencies including its own search position frequency and the search position frequency of the other PLL plus or minus the bit rate. A logic decision circuit responsive to the PLLs operates with a frequency synthesizer connected to a mixer at the input of the doubler so that when one PLL locks to one spectral line, the other PLL is operated at its respective frequencies to lock to the other spectral line.

7 Claims, 5 Drawing Figures

WIDE ACQUISITION RANGE MSK DEMODULATOR INPUT CIRCUIT

FIELD OF THE INVENTION

The present invention relates to an input circuit for a wide acquisition range minimum shift keying (MSK) demodulator and more particularly to a modified front end for a MSK demodulator to reduce the acquisition time where the initial frequency error is large compared to the bit rate.

BACKGROUND OF THE INVENTION

In situations in which little prior knowledge is available about the incoming frequency, for example, in a coherent digital communications system, conventional receiver circuits can require an unacceptably long time to search and acquire synchronism. This is particularly true in certain types of satellite communications.

SUMMARY OF THE INVENTION

In an improved circuit for a MSK demodulator, the input signal is fed through a mixer and a frequency doubler to produce two discrete spectral lines separated by the frequency of the bit rate to which a pair of phase-locked loops (PLL) are intended to lock. Each of the PLLs is coupled to the doubler and to a logic decision circuit. A frequency synthesizer scans the input signal until one PLL locks to one spectral line. The logic circuit then commands the second PLL to change frequency until it locks to the other spectral line. Each PLL includes a voltage controlled oscillator (VCO), a programmable divider and phase detector and is settable to assume one of three frequencies including its own search position frequency and the search position frequency of the other PLL plus or minus the bit rate frequency. A PLL assumes one of its three operating frequencies (but one at a time) by changing the division ratio of the divider between the VCO and the phase detector.

BRIEF DESCRIPTION OF THE INVENTION

Figure 1:
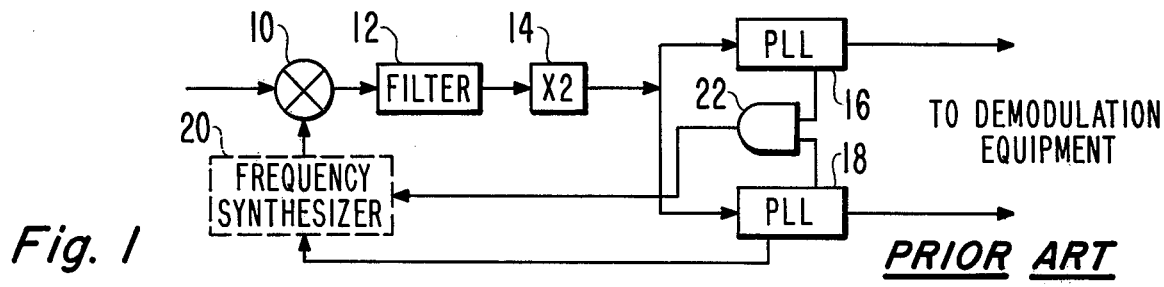
FIG. 1 is a block diagram of the pertinent portion of a prior art MSK receiver.

A prior art front end for a MSK demodulator is shown in FIG. 1. It relates to the type contemplated by R. de Buda in an article entitled "Coherent Demodulation of Frequency - Shift Keying with Low Deviation Ratio," which appeared in IEEE Trans. on Communications, June, 1972. The input MSK signal passes from a mixer 10 to a filter 12 and through a frequency doubler 14. In this type of receiver, the frequency doubler 14 converts the MSK signal, which has a modulation indexx of ¼, to a FSK signal with modulation index of ½. The latter signal possesses two discrete spectral lines in the frequency spectrum separated by a frequency equal to the bit rate R. Two phase-locked loops (PLL) 16 and 18, which are operated in parallel and coupled to the doubler 14, individually lock to a different one of the spectral lines at the output of the doubler 14.

When the acquisition range is narrow, that is, when the deviation of the input frequency from its normal value is small enough so that the signals at the input of the PLL 16 and 18 are within the locking ranges of the loops, no problem exists. However, very often, the frequency errors are large compared to the lock ranges such as in certain cases when satellites are used to support modest bit rates. In this case, an additional apparatus such s a synthesizer 20 is used to search for the input signals by a suitable scan technique. The synthesizer 20 is connected at an input of the mixer 10 and is responsive to PLL 18 and to an AND gate 22 connected to the two PLLs 16 and 18. The AND gate 22 produces an output when the lock detectors of both PLLs indicate PLL lock. Gate 22 is connected to the frequency synthesizer 20 so that, when lock is detected by the lock detectors, the AND gate output stops the frequency scan. The time for the search apparatus to place the input signals within the lock ranges of the PLLs 16 and 18 may be relatively long. A conventional PSK (Phase Shift Keying) - type low bit rate modem used for satellite communications may require up to 45 seconds to search. The two signals obtained at the output of the PLLs 16 and 18 are fed to auxiliary equipment (not shown) for demodulation purposes and to recover a clock.

In the input circuit for a MSK receiver described in FIG. 1, the two PLLs 16 and 18 run at their idling frequencies until they can lock with their nominal frequency separation at the bit rate R. The nominal frequency separation is equivalent to the bit rate because, in a doubled MSK signal, the two spectral lines that are present, are separated in frequency by an amount equal to the bit rate R.

Figure 2:
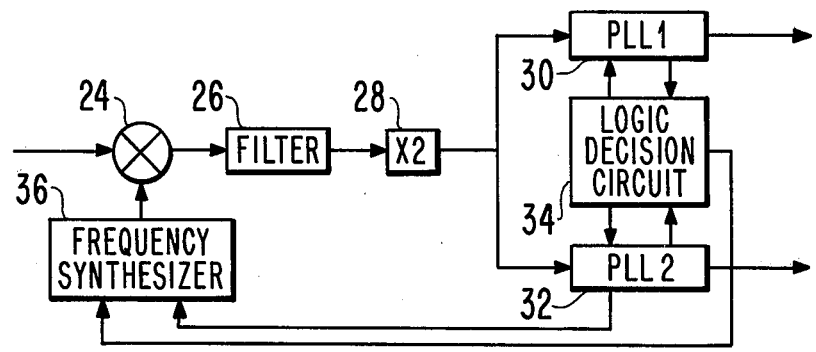
FIG. 2 is a block diagram of an input circuit for a MSK demodulator according to one embodiment of the present invention.

Turning to the present invention as shown in FIG. 2, an input signal passes consecutively through a mixer 24, a filter 26 and a frequency doubler 28 to produce two spectral lines directed towards the two PLLs 30 and 32. Each PLL has its own search position frequency. Special use is made of the fact that the two PLLs 30 and 32 are present and that they need not operate at frequencies separated by the bit rate until after the acquisition process is complete and demodulation is about to begin. For this purpose, a logic decision circuit 34 is connected to the two PLLs to control the latter and the synthesizer with frequency scan 36. The logic decision circuitry 34 performs as follows:

i. It monitors the state of PLL lock by examining the output of the lock detector of each PLL.

ii. It sends a code to the divider in the feedback path of each PLL to tell it what frequency division ratio to assume.

iii. It contains the AND gate function referred to in the description of FIG. 1 to stop or release the frequency scan of the frequency synthesizer.

Because the present invention is contemplated for cases in which the frequency error is large compared to the bit rate, the PLLs are configured to idle with a search position frequency separation large with respect to the bit rate, each one monitoring half of the region of frequency uncertainty for the input signal.

Figure 3:
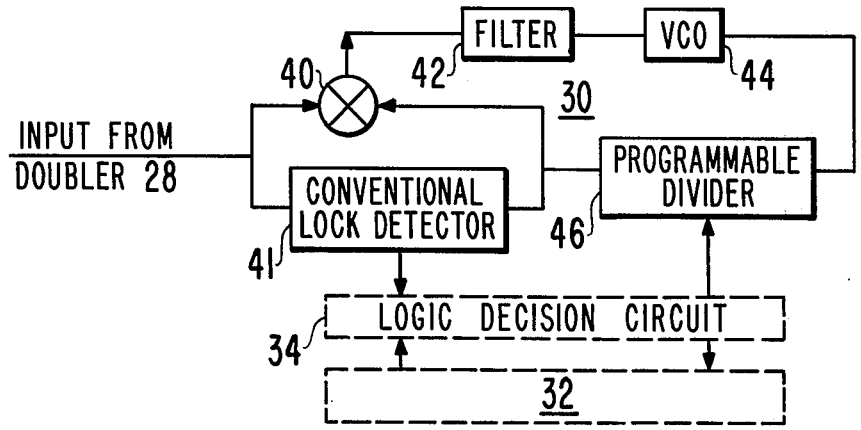
FIG. 3 is a block diagram of one of the PLLS shown in FIG. 2 according to the present invention.

The frequency synthesizer 36 scans until one of the two PLLs 30 and 32 locks to one of the spectral lines. The manner in which a PLL locks to a line is described in "Phaselock Techniques" by F. M. Gardner, John Wiley and Sons 1966. The logic circuit 34 then commands the other PLL to change frequency to that of the locked PLL plus the bit rate and, if no lock of the other PLL occurs, to that of the locked PLL minus the bit rate. One specific embodiment of a phase-locked loop is illustrated in FIG. 3. It comprises a mixer 40 used as a phase detector, a conventional lock detector 41, a filter 42, a voltage controlled oscillator (VC0) 44 and a programmable frequency divider 46. Programmable dividers are known and described in electrical engineering text books such as "The TTL Handbook For Design Engineers" published by Texas Instruments Incorporated. Frequency changes are carried out by means of changes in the ratio of the divider 46 located at the output of the VCO 44. The divider 46 is chosen so that each PLL can assume three frequencies, that is, its own search frequency, and the two frequencies corresponding to the search frequency of the other PLL plus or minus the bit rate R.

The lock detector 41 provides the means to arrest the frequency scan of the synthesizer 36. It also detects the lock condition of the PLLs 30 and 32 when they have acquired synchronism. The dividers 46 of the PLLs are then reset, if required, by the logic decision circuit 34. The mixer 40 may be a phase detector of the type proposed by C. J. Byrne in an article published in BSTJ 1962 and entitled "Properties And Design Of The Phase-Controlled Oscillator With A Sawtooth Comparator" if a digitally implemented PLL is desired, or a diode-type phase detector if an analog implementation is desired. The voltage controlled oscillator 44 may be selected from a crystal oscillator, an integrated circuit multivibrator or a controlled division device operating on a high reference frequency. The connection between the PLL 32 and the frequency synthesizer 36 is to permit PLL 32 loop stress to be used as correction signal for the frequency synthesizer so it can track drifts in the frequency of the input signal. A loop stress is a correction voltage from a phase detector such as 40 included in the PLL illustrated in FIG. 3.

Let us assume that M and N are the initial divider ratios in the feedback path for loops 30 and 32 respectively during the search phase. PLL 30 can assume frequency MR and also frequencies $(N-1)$ R or $(N+1)$ R and PLL 32 can assume frequency NR and also $(M-1)$ R and $(M+1)$ R.

Figure 4:
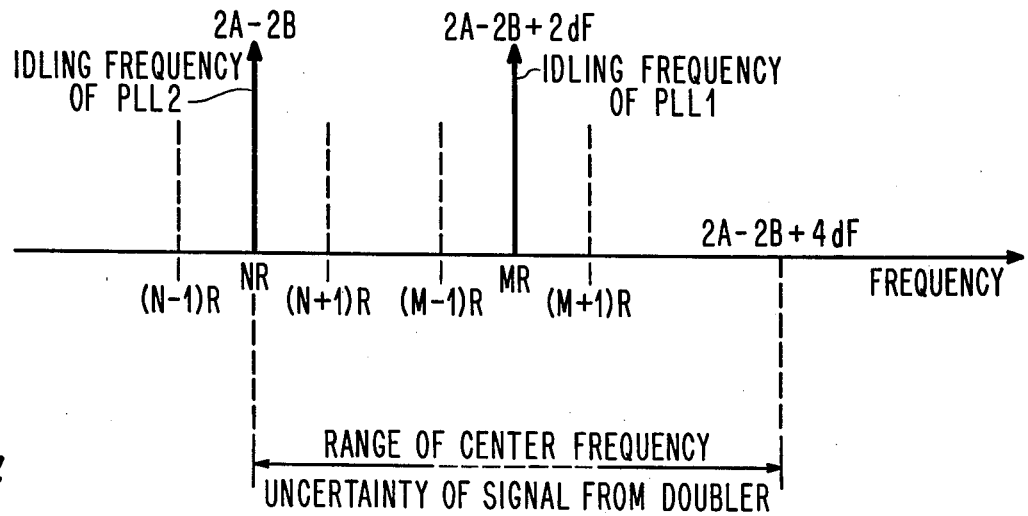
FIG. 4 is a schematic representation of a frequency plane diagram to illustrate the acquisition process.

The acquisition process is illustrated in FIG. 4. The input signal is of frequency $A \pm dF$ where $dF$ is the frequency uncertainty. If the frequency scanner of the synthesizer 36 starts searching at a frequency $B - dF$ and the frequency error of the signal is worst case (signal at $A + dF$), it can be easily demonstrated as explained below, that the maximum scan required will be about $dF$ until one of the loops locks. The exact value of the maximum scan is $dF$ minue one quarter the bit rate because of the position of the discrete lines of a doubled MSK signal with respect to its center frequency. The conditions represented in FIG. 4 shows one PLL (2) at an idling frequency $2A - 2B$ which is at one end of the range of frequency uncertainty and a second PLL (1) in the middle of the range of frequency uncertainty at frequency $2A - 2B + 2dF$. The range of frequency uncertainty of the signal from the frequency doubler is also shown on FIG. 4. It is to be noted that the factors of 2 repeatedly arise in FIG. 4 and in the discussion above because of the presence of the frequency doubler 28. In the worst case the frequency of the doubled MSK signal is $2A - 2B + 4dF$ and since the idling frequency of PLL (1) is $2A - 2B + 2dF$ the maximum scan required to bring PLL (1) into lock range is approximately $(4dF - 2dF) : 2$ which is $dF$, as stated above. Also as stated above, PLL(2) can assume additional frequencies $(M-1)$ R which is equivalent to $2A - 2B + 2dF - R$ and $(M+1)$ R which is equivalent to $2A - 2B + 2dF + R$ so that it will also be able to lock, once commanded to change frequency.

If a conventional MSK receiver were to be used, under the same conditions, with its PLLs idling at frequencies equidistant from the nominal center frequency of the doubled signal $(2A-2B)$ the maximum scan would be $2dF$. Therefore, the present invention effects an improvement in search time by a factor of approximately 2.

Other conditions are also possible. For example, the PLLs may be placed in positions equidistant from the center of the range of frequency uncertainty. Or in a particular application, it may be desirable for the purpose of simplicity to have only one extra frequency position for each PLL to assume, or only allow one of the PLLs to assume an extra frequency position.

The logic decision circuit 34 may be based on circuits whose functions are defined by Boolean logic and implemented by using standard techniques such as those described in "Pulse Digital And Switching Waveforms" by Millman and Taub and published by McGraw-Hill. Example:

Let the signal from PLL 1 in FIG. 2 = X (indicates lock) Let the signal from PLL 2 in FIG. 2 = y Let the signal to PLL 1 from decision circuit 34 = CD where CD is a 2 bit code indicating the divide ratio.

$CD1 = 00 =$ divide ratio $M/K$ $CD2 = 01 =$ divide ratio $N-1/K$ $CD3 = 10 =$ divide ratio $N+1/K$ $K$ is constant.

The basic requirements of the logic decision circuitry for controlling PLL 1 may be expressed by the following Boolean equations:

$CD1 = \overline{X} \cdot \overline{Y}$ $CD2 = Y \cdot \overline{X} \cdot TD1$ $CD3 = Y \cdot \overline{X} \cdot TD2$ where $TD1$ and $TD2$ are the outputs of memory devices indicating lock times for PLL 1 acquisition at frequencies MR and $(N-1)$ R have elapsed. Requirements for the control of PLL 2 are analogous.

Scan Arrest Signal = X.Y

This circuit is of elementary design and requires very few integrated circuits.

Figure 5:
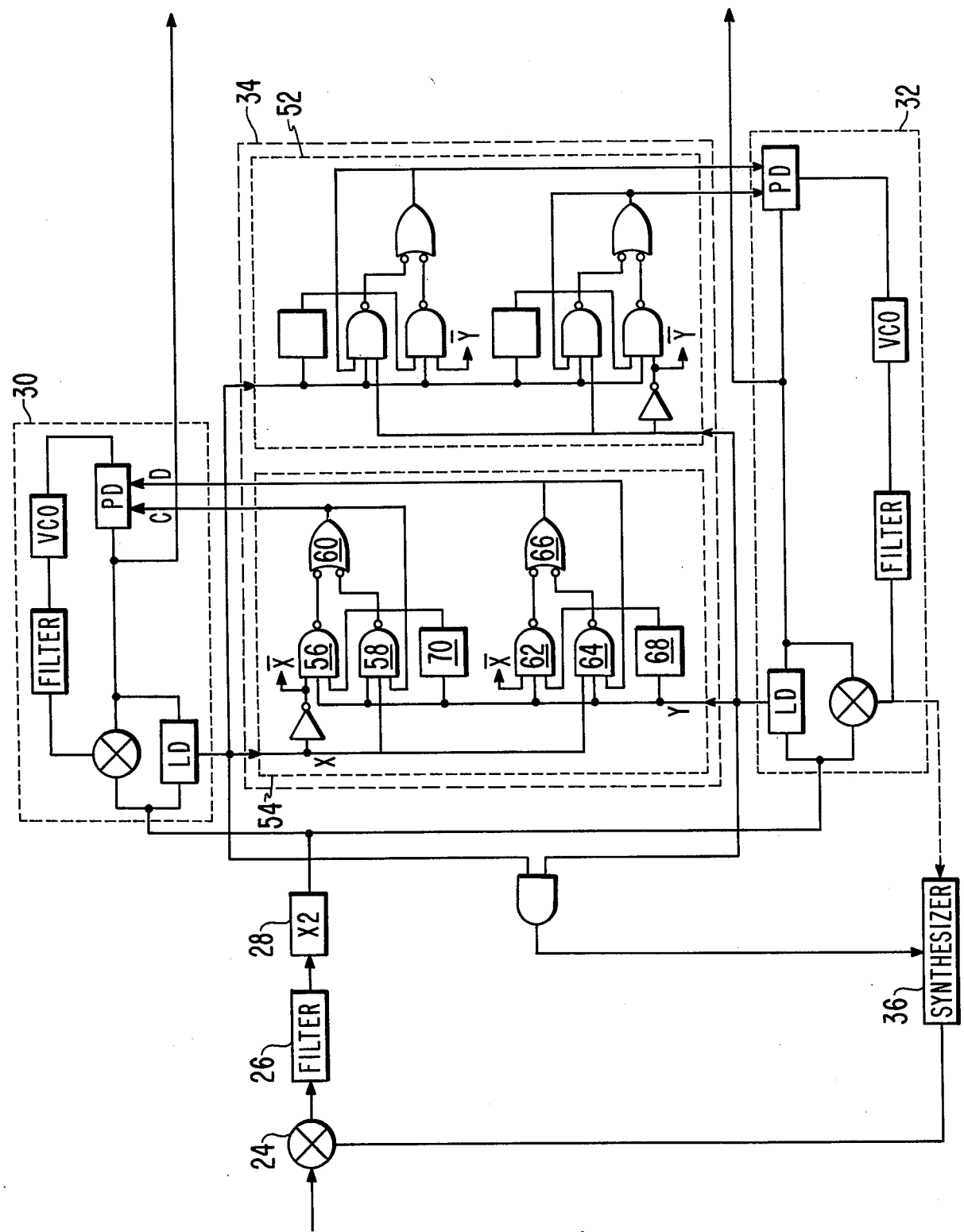
FIG. 5 is a detailed block diagram of one example of an input circuit for a MSK demodulator according to the invention.

A specific embodiment of a logic decision circuit is illustrated in FIG. 5. It particularly applies to the conditions wherein the PLLs have two extra frequency positions. The decision circuit is shown in box 34 and is constituted by two similar circuits each respectively included in boxes 52 and 54. The half circuit 54 is designed with two consecutive time delays 68 and 70 each adapted to allow the triggering of three NAND gates respectively, 56, 58, 60 and 62, 64 and 66 mounted so as to afford the PLLs advance to lock at the desired frequency.

The operation of the logic circuit 54 occurs as follows:

The initial condition is represented by X=Y=0 indicating neither PLL has locked. Because gates 56 and 58 and 62 and 64 are NAND gates their outputs are always 1 or "high" under these conditions so the outputs of 60 and 66 are both 0. i.e. CD=00 the condition for no lock.

If Y becomes 1 (and indicates PLL 32 lock) and X is still zero (PLL 30 not locked), no change will take place for a time delay determined by time delay 68. The purpose of the delay is to afford PLL 30 a chance to lock at its present frequency. But time delay 68 is triggered by Y going to 1 so after a delay, time delay 68 output goes to 1. The output of gate 62 becomes 0 and the output of 66 goes to 1 since it is a NAND gate and has a 0 input. CD is now 01, permitting PLL 30 to try to lock at a new frequency. If it does lock, X becomes 1 and the output of gate 64 goes to 0 holding gate 66 at 1. This hold is necessary because the output of time delay 68 does not stay at 1 indefinitely after triggering by Y.

If PLL 30 does not lock at CD=01, time delay 70, which was also triggered by Y goes to 1 forcing gate 56 output to a 0 (since it already has two 1 inputs) and gate 60 output goes up. CD is now at 10, permitting PLL 30 to try to lock at a third frequency. If it does, X becomes 1 and gate 58 output is locked at 0 since it is connected to the gate 60 at 1 output also, so gate 60 is locked at 1 and gate 66 stays at 0. Thus the feedback connections from gate 60 to gate 58 and from gate 66 to gate 64 "lock" or "hold" the present value of CD, which is desired in the case of phaselock. The same description applies to the other half of the decision circuitry.

What is claimed is:

1. An input circuit for a wide acquisition range minimum shift keying demodulator adapted to scan an input signal having a region of frequency uncertainty and a given bit rate R, said circuit comprising:
    a mixer, a filter and a frequency doubler coupled in that order and responsive to said input signal being applied to said mixer, said doubler adapted to produce two spectral lines,
    a pair of PLLs each coupled to the output of said doubler, each of said PLLs adapted to monitor half of the said region of frequency uncertainty, each of said PLLs comprising a voltage controlled oscillator (VCO) and a programmable divider located at the output of the VCO and adapted to allow the corresponding PLL to assume at least two operating frequencies, and a lock detector adapted to permit the corresponding PLL to lock to one of the two spectral lines,
    a frequency synthesizer coupled to said mixer and adapted to scan the input signal until one of said PLLs locks to one of the spectral lines,
    a logic decision circuit coupled to each of said PLLs and to said synthesizer to respond to the state of the lock detector of the PLLs to control the divider of each of said PLLs to make the latter assume one or the other of said operating frequencies and to stop the scanning operation of the frequency synthesizer,
    whereby the frequency synthesizer scans the input signal until one PLL locks to one of the spectral lines, the logic circuit being responsive to the locked condition of said one PLL to command the divider of the other PLL to sequentially assume one of its operating frequencies until the said other PLL locks to the second of said lines.

2. A circuit as recited in claim 1, wherein each PLL is allowed to assume one of three frequencies including a search position frequency and the search position frequency of the other PLL plus and minus said given bit rate R,
    whereby the frequency synthesizer scans until the said one PLL locks to one spectral line and subsequently the said logic circuit commands the second PLL to change frequency to that of said one PLL plus the bit rate or to that of said one PLL minus the bit rate to lock said second PLL to said second spectral line.

3. A circuit as recited in claim 2, wherein the said one and the other PLL are provided with division ratios respectively of M and N in order to assume frequencies of MR and NR, the said one PLL being adapted to assume also frequencies (N−1) R and (N+1) R and the other PLL to assume frequencies of (M−1) R and (M+1) R.

4. A circuit as recited in claim 2 wherein the logic circuit includes two similar half circuits, each half circuit being connected to the said lock detector of each of said PLLs, and comprises two consecutive time delays and a set of at least three NAND gates associated with each time delay to allow one of said PLLs to lock to a spectral line during a period determined by one of said time delays, the lock condition of each lock detector being adapted to be fed to the corresponding programmable divider of each PLL.

5. In combination,
    input means providing a signal having first and second discrete spectral lines in the frequency spectrum,
    a pair of phase locked loops (PLL) coupled to said input means each settable to at least two operating frequencies,
    means coupled to said input means for scanning the frequency of said signal until one of said PLLs locks to one of said spectral lines, and
    decision circuit means responsive to the locking of said one PLL to one of said spectral lines to cause said second PLL to assume one or the other of its operating frequencies to lock said second PLL to said second spectral line.

6. In a combination as claimed in claim 5, wherein said signal has a given bit rate,
    each of said phase locked loops (PLL) being settable to one of three frequencies including a search position frequency and the search position frequency of the other PLL plus and minus said given bit rate, said PLLs assuming said respective search position frequencies prior to the locking of a PLL to one of said lines,
    said decision circuit means being responsive to one of said PLLs locking to one of said spectral lines to cause said second PLL to assume the search position frequency of said one PLL plus the bit rate or the search position frequency of said one PLL minus the bit rate to lock said second PLL to said second spectral line.

7. In a combination as claimed in claim 5,
    said scanning means including a frequency synthesizer connected to scan the frequency of said signal,
    means coupling said decision circuit means to said scanning means to stop said scanning of the frequency of said signal upon one of said PLLs locking to one of said spectral lines.

* * * * *